United States Patent
Nishiyama et al.

(10) Patent No.: US 12,156,417 B2
(45) Date of Patent: Nov. 26, 2024

(54) DISPLAY DEVICE FOR SIMPLIFYING A PROCESS OF FORMING A COMMIN FUNCTION LAYER

(71) Applicant: SHARP KABUSHIKI KAISHA, Sakai (JP)

(72) Inventors: Takayuki Nishiyama, Sakai (JP); Ryo Yonebayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 542 days.

(21) Appl. No.: 17/436,833

(22) PCT Filed: Mar. 19, 2019

(86) PCT No.: PCT/JP2019/011542
§ 371 (c)(1),
(2) Date: Sep. 7, 2021

(87) PCT Pub. No.: WO2020/188768
PCT Pub. Date: Sep. 24, 2020

(65) Prior Publication Data
US 2022/0181577 A1   Jun. 9, 2022

(51) Int. Cl.
*H10K 50/00* (2023.01)
*H10K 50/17* (2023.01)
(Continued)

(52) U.S. Cl.
CPC ......... *H10K 50/824* (2023.02); *H10K 50/171* (2023.02); *H10K 50/841* (2023.02); *H10K 59/131* (2023.02)

(58) Field of Classification Search
CPC .................. H10K 50/824; H10K 50/814
See application file for complete search history.

(56) References Cited

U.S. PATENT DOCUMENTS

| | | | |
|---|---|---|---|
| 6,900,470 B2 | 5/2005 | Kobayashi et al. | |
| 2005/0077816 A1 | 4/2005 | Yamada et al. | |

(Continued)

FOREIGN PATENT DOCUMENTS

| | | | |
|---|---|---|---|
| JP | 2005-093398 A | 4/2005 | |
| JP | 2006-278128 A | 10/2006 | |

(Continued)

OTHER PUBLICATIONS

"Overlying." Merriam-Webster.com. 2024. http://www.merriam-webster.com (Feb. 3, 2024). (Year: 2024).*

*Primary Examiner* — Reema Patel
(74) *Attorney, Agent, or Firm* — ScienBiziP, P.C.

(57) ABSTRACT

A display device provided with a light-emitting element layer in which a plurality of light-emitting elements each including a first electrode, a function layer, and a second electrode are formed. An auxiliary electrode is provided on a lower side of an edge cover film covering an edge of the first electrode, a function layer includes a common function layer common to the plurality of light-emitting elements and individual function layers, each of which corresponding to each of the plurality of light-emitting elements, the common function layer includes an upper common function layer provided between the light-emitting layers included in the individual function layers, respectively, and the second electrode, and a film thickness of the auxiliary electrode is greater than a film thickness of the upper common function layer.

15 Claims, 11 Drawing Sheets

(51) Int. Cl.
  *H10K 50/824* (2023.01)
  *H10K 50/84* (2023.01)
  *H10K 59/131* (2023.01)

(56) References Cited

U.S. PATENT DOCUMENTS

| | | |
|---|---|---|
| 2006/0232199 A1 | 10/2006 | Takahashi |
| 2007/0066178 A1 | 3/2007 | Yamada et al. |
| 2011/0316007 A1 | 12/2011 | Sagawa |
| 2014/0084267 A1 | 3/2014 | Yoon et al. |
| 2014/0312323 A1 | 10/2014 | Park et al. |
| 2016/0043161 A1 | 2/2016 | Miyazawa |
| 2017/0194415 A1 | 7/2017 | Choi et al. |
| 2018/0151631 A1 | 5/2018 | Lee et al. |

FOREIGN PATENT DOCUMENTS

| | | | |
|---|---|---|---|
| JP | 2009-283304 A | 12/2009 | |
| JP | 2010-085866 A | 4/2010 | |
| JP | 2012-014868 A | 1/2012 | |
| JP | 2014-067993 A | 4/2014 | |
| JP | 2016-039029 A | 3/2016 | |
| JP | 2017-120771 A | 7/2017 | |
| JP | 2018-093196 A | 6/2018 | |
| WO | WO-2012001728 A1 * | 1/2012 | ......... H01L 51/5228 |

* cited by examiner (a)

| Layer type | Reference sign | Film thickness [nm] | Name |
|---|---|---|---|
| Common function layer | 24k | 10 | Electron injection layer |
| | | 8 | Electron transport layer |
| | | 10 | Hole blocking layer |
| | 24c | 130 | Hole transport layer |
| | | | Hole injection layer |
| Individual function layer | 24R | 110 | Light-emitting layer (red) |
| | | | Hole transport layer (red) |
| | 24G | 40 | Light-emitting layer (green) |
| | | | Hole transport layer (green) |
| | 24B | 20 | Light-emitting layer (blue) |
| | | | Electron blocking layer (blue) |

(b)

| Reference sign | Material | Film thickness [nm] |
|---|---|---|
| FE,22 | ITO | 10 |
| | Ag | 80 |
| | ITO | 10 |

(c)

| Reference sign | Material | Film thickness [nm] |
|---|---|---|
| 25 | Yb | 10 |
| | Ag alloy | 20 |

(d)

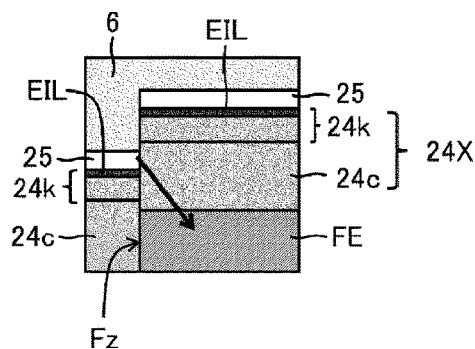

FIG. 5

DISPLAY DEVICE FOR SIMPLIFYING A PROCESS OF FORMING A COMMIN FUNCTION LAYER

TECHNICAL FIELD

The disclosure relates to a display device.

SUMMARY

PTL 1 discloses a configuration, in a light-emitting element layer in which a first electrode, a partition, an organic EL layer, and a second electrode (common cathode) are formed in this order, in which an auxiliary wiring line for lowering the resistance of the cathode is provided in the same layer as the first electrode, and the second electrode and the auxiliary wiring line are in contact with each other by a contact hole formed in the partition.

CITATION LIST

Patent Literature

PTL 1: U.S. Pat. No. 6,900,470

SUMMARY OF INVENTION

Technical Problem

In the above-mentioned know display device, in order to make the second electrode and the auxiliary wiring line (auxiliary electrode) directly contact each other, a common function layer such as an electron injection layer included in the organic EL layer needs to be removed from the contact hole. For this reason, in the above-mentioned know display device, a process of forming the common function layer (vapor deposition process) becomes complicated, and there may be a problem that it is difficult to suppress an increase in manufacturing cost.

Solution to Problem

A display device according to an embodiment of the disclosure is a display device having a display region provided with a plurality of subpixels and a frame region surrounding the display region. The display device includes a thin film transistor layer, a light-emitting element layer in which a plurality of light-emitting elements each including a first electrode, a function layer, and a second electrode are formed, and a sealing layer configured to seal the light-emitting element layer. The light-emitting element layer is provided with an edge cover film that has an opening configured to expose the first electrode and covers an edge of the first electrode, the second electrode is provided in common to the plurality of light-emitting elements, an auxiliary electrode electrically connected to the second electrode is provided on an upper side or a lower side of the edge cover film, the function layer includes a common function layer commonly provided for the plurality of light-emitting elements and individual function layers, each of which is provided corresponding to each of the plurality of light-emitting elements, the common function layer includes an upper common function layer provided between light-emitting layers included in the individual function layers, respectively, and the second electrode, and a film thickness of the auxiliary electrode is greater than a film thickness of the upper common function layer.

Advantageous Effects

According to one aspect of the disclosure, an electron injection layer can be separated stepwise at the upper portion of an end portion of the auxiliary electrode. Therefore, the second electrode and the auxiliary electrode can be electrically connected while simplifying the process of forming the common function layer, and a low-cost display device can be easily configured.

BRIEF DESCRIPTION OF DRAWINGS

FIG. 5(a) is a table showing configuration examples of a common function layer and an individual function layer, FIG. 5(b) is a table showing configuration example of a first electrode and an auxiliary electrode, FIG. 5(c) is a table showing a configuration of a second electrode, and FIG. 5(d) is a schematic cross-sectional view illustrating an enlarged view of a portion surrounded by a broken line in FIG. 4 (near a bottom portion of a contact hole).

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

First Embodiment

Figure 1:
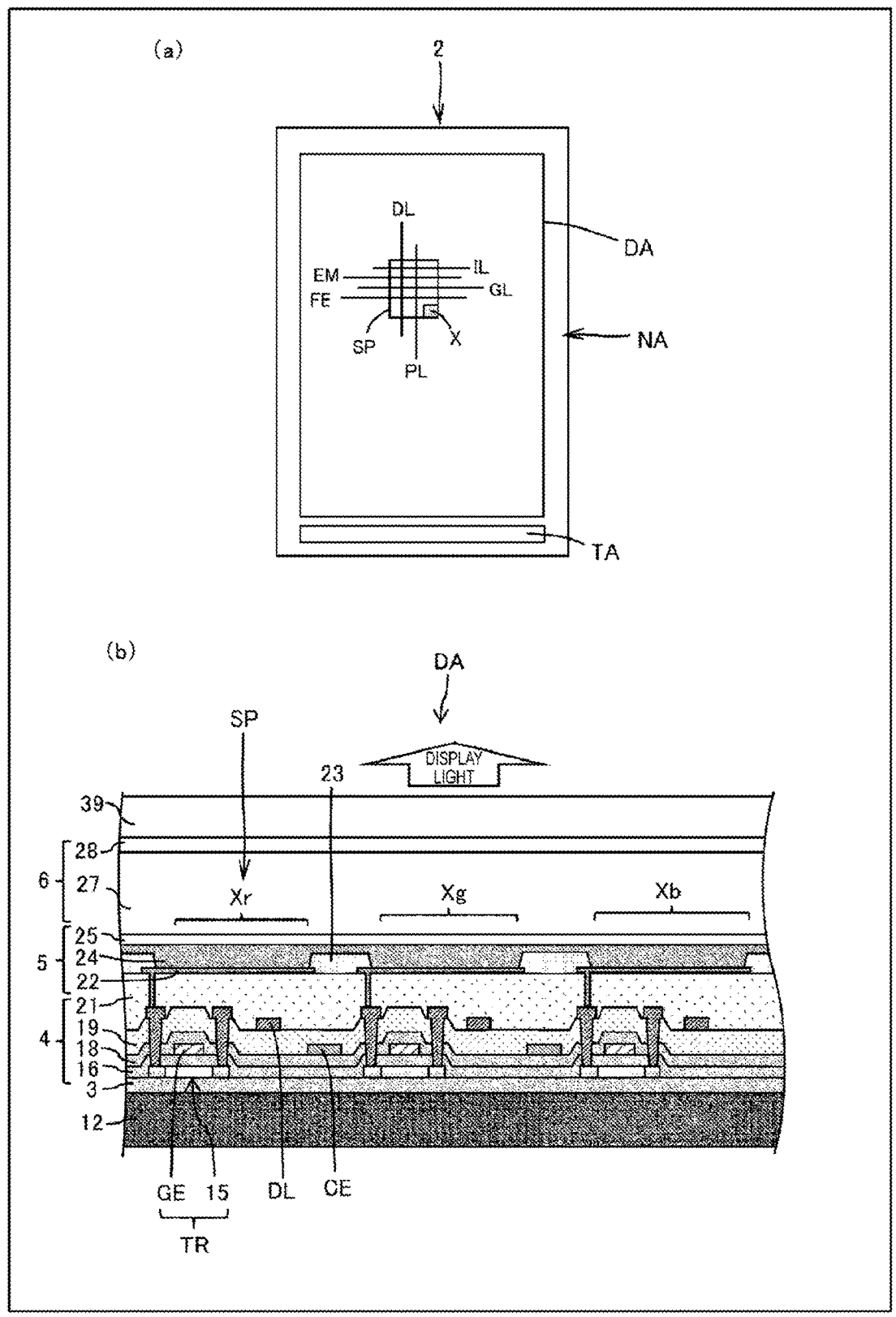
FIG. 1(a) is a schematic plan view illustrating a configuration of a display device of a first embodiment.
FIG. 1(b) is a cross-sectional view illustrating the configuration of the display device of the first embodiment.

FIG. 1(a) is a schematic plan view illustrating a configuration of a display device of a first embodiment, and FIG. 1(b) is a cross-sectional view illustrating the configuration of the display device of the first embodiment.

In a display device 2, a barrier layer 3, a thin film transistor layer 4, a top emission light-emitting element layer 5, and a sealing layer 6 are provided in this order on a base material 12, and a plurality of subpixels SP are formed in a display region DA. A terminal portion TA for mounting an electronic circuit board (IC chip, FPC, or the like) is formed on a frame portion NA surrounding the display region DA.

The base material 12 may be a glass substrate or a flexible substrate including a resin film such as polyimide film. The flexible substrate can also be formed by two resin films and an inorganic insulating film sandwiched therebetween. A film such as a PET film may be attached to the lower surface of the base material 12. A flexible display device 2 may also be formed by using the flexible substrate as the base material 12.

The barrier layer 3 is a layer that inhibits foreign matter such as water and oxygen from entering the thin film transistor layer 4 and the light-emitting element layer 5. For example, the barrier layer can be constituted of a silicon oxide film, a silicon nitride film, or a silicon oxynitride film, or a layered film thereof formed by chemical vapor deposition (CVD).

As illustrated in FIG. 1(b), the thin film transistor layer 4 includes a semiconductor layer (including a semiconductor film 15) as an upper layer overlying the barrier layer 3, an inorganic insulating film 16 (gate insulating film) as an upper layer overlying the semiconductor layer, a first metal layer (including a gate electrode GE) as an upper layer overlying the inorganic insulating film 16, an inorganic insulating film 18 as an upper layer overlying the first metal layer, a second metal layer (including a capacitance electrode CE) as an upper layer overlying the inorganic insulating film 18, an inorganic insulating film 19 as an upper layer overlying the second metal layer, a third metal layer (including a data signal line DL) as an upper layer overlying the inorganic insulating film 19, and a flattening film 21 as an upper layer overlying the third metal layer.

The semiconductor layer is constituted of, for example, amorphous silicon, Low-Temperature PolySilicon (LTPS), or an oxide semiconductor, and a thin film transistor TR is configured so as to include the gate electrode GE and the semiconductor film 15. The thin film transistor TR in the figure has a bottom gate structure, but may have a top gate structure.

A light-emitting element and a control circuit thereof are provided for each of subpixels SP in the display region DA, and the control circuit and wiring lines connected to the control circuit are formed in the thin film transistor layer 4. Examples of the wiring lines connected to the control circuit include, for example, a scanning signal line GL and a light emission control line EM both formed in the first metal layer, an initialization power source line IL formed in the second metal layer, and the data signal line DL and a high voltage power source line PL both formed in the third metal layer. The control circuit includes a drive transistor that controls the current of the light-emitting element, a write transistor that is electrically connected to the scanning signal line, a light emission control transistor that is electrically connected to the light emission control line, and the like.

The first metal layer, the second metal layer, and the third metal layer are each constituted of, for example, a single-layer film or a multi-layer film of metal including at least one of aluminum, tungsten, molybdenum, tantalum, chromium, titanium, and copper.

Each of the inorganic insulating films 16, 18, and 19 can be constituted of, for example, a silicon oxide (SiOx) film or a silicon nitride (SiNx) film, or a layered film thereof, formed by using CVD. The flattening film 21 can be formed of, for example, a coatable organic material such as polyimide or acrylic resin.

The light-emitting element layer 5 includes a first electrode (anode) 22 and an auxiliary electrode FE both formed on the flattening film 21, an insulating edge cover film 23 covering edges of the first electrode 22, a function layer 24 as an upper layer overlying the edge cover film 23, and a second electrode (cathode) 25 as an upper layer overlying the function layer 24. The edge cover film 23 is formed by applying an organic material such as polyimide or acrylic resin and then patterning the organic material by photolithography, for example.

The light-emitting element layer 5 is formed with a light-emitting element Xr (for red light emission), a light-emitting element Xg (for green light emission), and a light-emitting element Xb (for blue light emission) having different emission colors, and each of the light-emitting elements includes the island-shaped first electrode 22, the function layer 24, and the second electrode 25. The second electrode 25 is a solid-like common electrode common to the plurality of light-emitting elements.

Each of the light-emitting elements Xr, Xg, and Xb may be, for example, an Organic Light-Emitting Diode (OLED) including an organic layer as a light-emitting layer, or may be a Quantum dot Light-Emitting Diode (QLED) including a quantum dot layer as the light-emitting layer.

The function layer 24 is formed by, for example, layering a hole injection layer, a hole transport layer, a light-emitting layer, a hole blocking layer, an electron transport layer, and an electron injection layer in this order with the hole injection layer being the bottom layer. The light-emitting layer is formed in an island shape so as to overlap an opening of the edge cover film 23 formed for each light-emitting element. The hole injection layer, the hole transport layer, the hole blocking layer, the electron transport layer, and the electron injection layer each can be a common layer common to the plurality of light-emitting elements (Xr, Xg, and Xb). For example, in the light-emitting element Xb (for blue light emission), an electron blocking layer may be formed in an island shape as the lower layer underlying the light-emitting layer.

When the light-emitting layer of the OLED (organic layer) is formed by vapor deposition, a Fine Metal Mask (FMM) is used. The FMM is a sheet with a large number of openings, and an island-shaped organic layer (corresponding to each subpixel) is formed by an organic material passing through each of the openings.

The quantum dot layer of the QLED (light-emitting layer), for example, an island-shaped quantum dot layer (corresponding to each subpixel) can be formed by applying a solution in which quantum dots are diffused in a solvent and patterning the quantum dot layer by photolithography.

The first electrode 22 (anode electrode) is constituted of, for example, a layered film of Indium Tin Oxide (ITO) and silver (Ag) or an alloy containing Ag, and has light reflectivity. The second electrode 25 (cathode electrode) is constituted of, for example, a layered film of an Ag alloy or an Ag alloy containing magnesium and ytterbium (Yb), and has optical transparency.

When the light-emitting elements Xr, Xg, and Xb are OLEDs, positive holes and electrons recombine inside the light-emitting layer in response to a drive current between the first electrode 22 and the second electrode 25, and light is emitted when the excitons generated in this manner transition to a ground state. Since the second electrode 25 is highly transparent and the first electrode 22 is light reflective, the light emitted from the EL layer 24 is directed upward to configure a top-emission structure.

When the light-emitting elements Xr, Xg, and Xb are QLEDs, positive holes and electrons recombine inside the light-emitting layer in response to a drive current between the first electrode 22 and the second electrode 25, and light (fluorescence) is emitted when the excitons generated in this manner transition from the conduction band level of the quantum dots to the valence band level.

A light-emitting element (such as an inorganic light-emitting diode) other than an OLED or QLED may be formed in the light-emitting element layer 5.

The sealing layer 6 is transparent and includes an organic film 27 formed directly on the second electrode 25 (i.e., in contact with the second electrode 25), and an inorganic sealing film 28 as an upper layer overlying the organic film 27. The sealing layer 6 covering the light-emitting element layer 5 inhibits foreign matter such as water and oxygen from penetrating the light-emitting element layer 5.

The organic film 27 has a flattening effect and is transparent, and can be formed by, for example, ink jet coating using a coatable organic material. The inorganic sealing film 28 is an inorganic insulating film, and can be constituted of, for example, a silicon oxide film, a silicon nitride film, a silicon oxynitride film, or a layered film thereof formed by CVD.

A function film 39 has at least one of an optical compensation function, a touch sensor function, a protection function, and the like.

Figure 2:
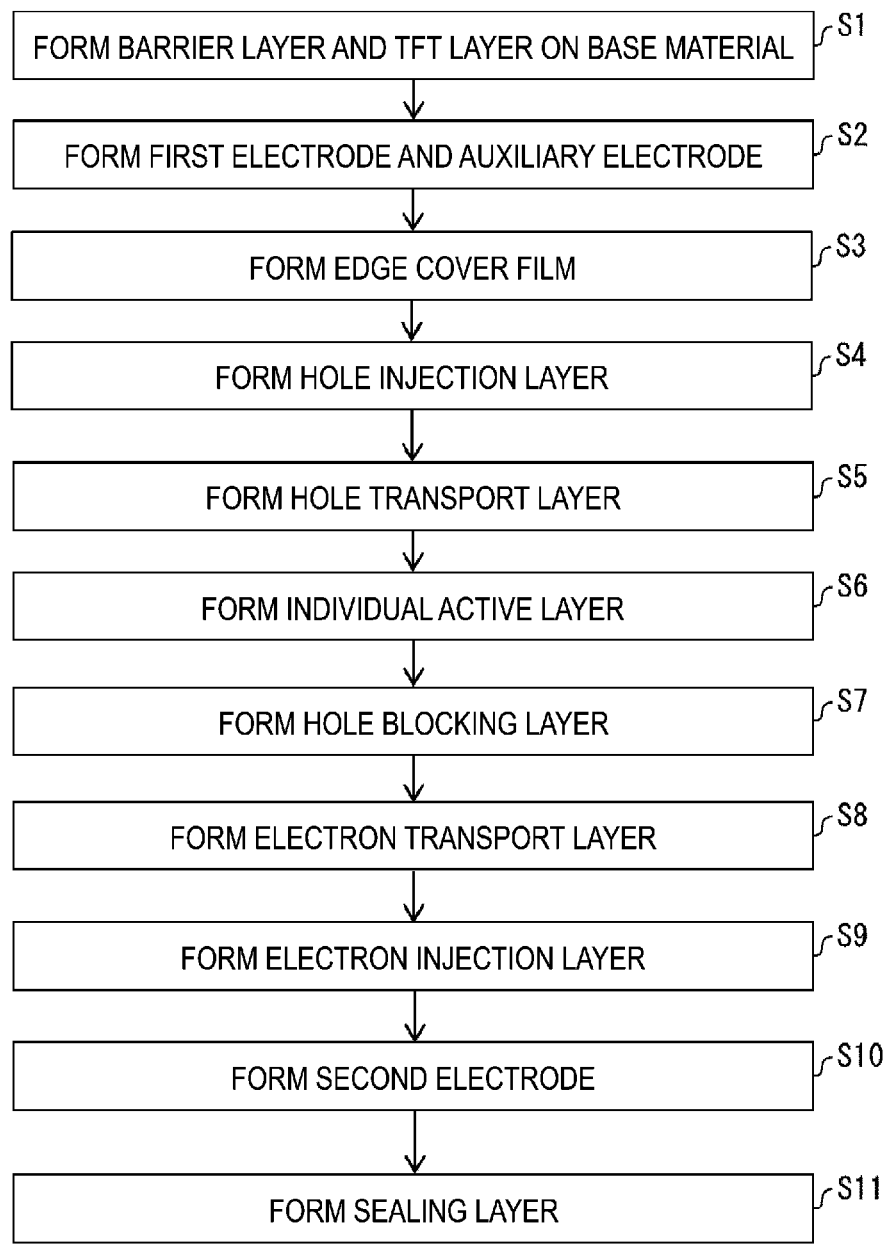
FIG. 2 is a flowchart illustrating a manufacturing method of the display device.

FIG. 2 is a flowchart illustrating a manufacturing method of the display device 2. In step S1, the barrier layer 3 and the thin film transistor layer 4 are formed on the base material 12. In step S2, the first electrode 22 (anode electrode) is formed on the flattening film 21 by sputtering and photolithography. In step S3, the edge cover film 23 is formed. In step S4, the hole injection layer (common layer) is formed. In step S5, the hole transport layer (common layer) is formed. In step S6, the individual function layers (including at least the light-emitting layer) are formed. In step S7, the hole blocking layer (common layer) is formed. In step S8, the electron transport layer (common layer) is formed. In step S9, the electron injection layer EIL (common layer) is formed. In step S10, the second electrode 25 (common electrode) is formed. In step S11, the sealing layer 6 is formed. For each of steps S4 to S5 and S7 to S10 for forming the common layer or the common electrode, vapor deposition or sputtering using, for example, an open mask (a mask having openings for one panel) can be applied.

Figure 3:
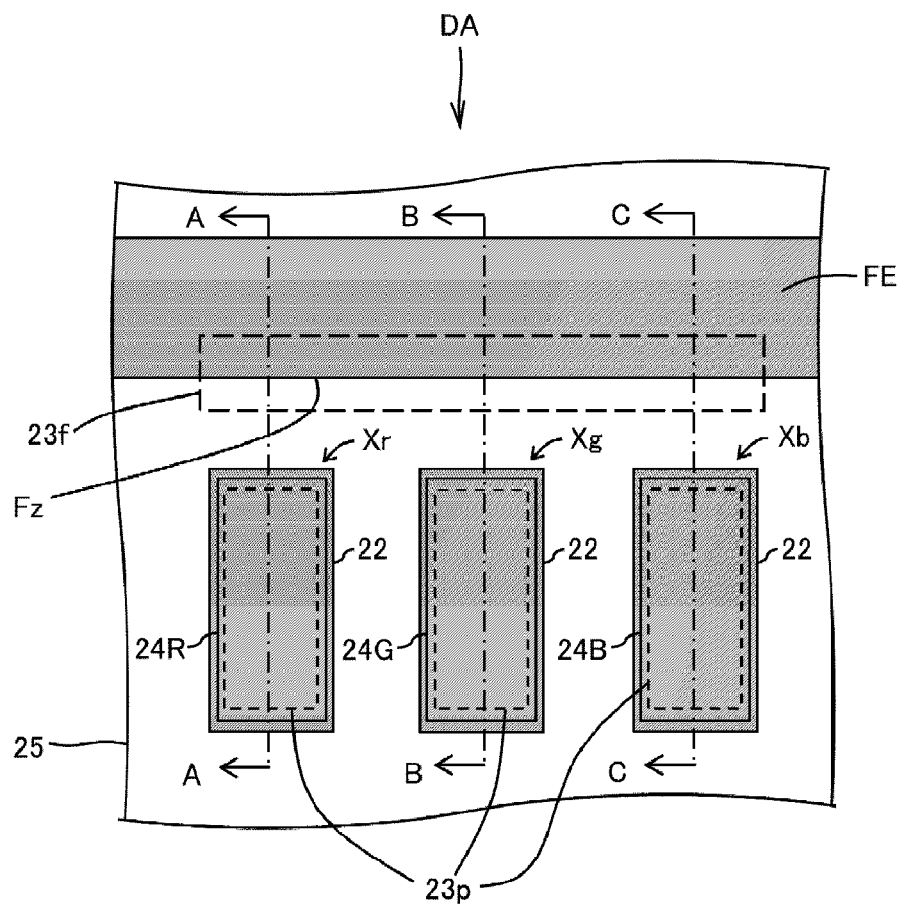
FIG. 3 is a plan view illustrating a configuration of a display region.
Figure 4:
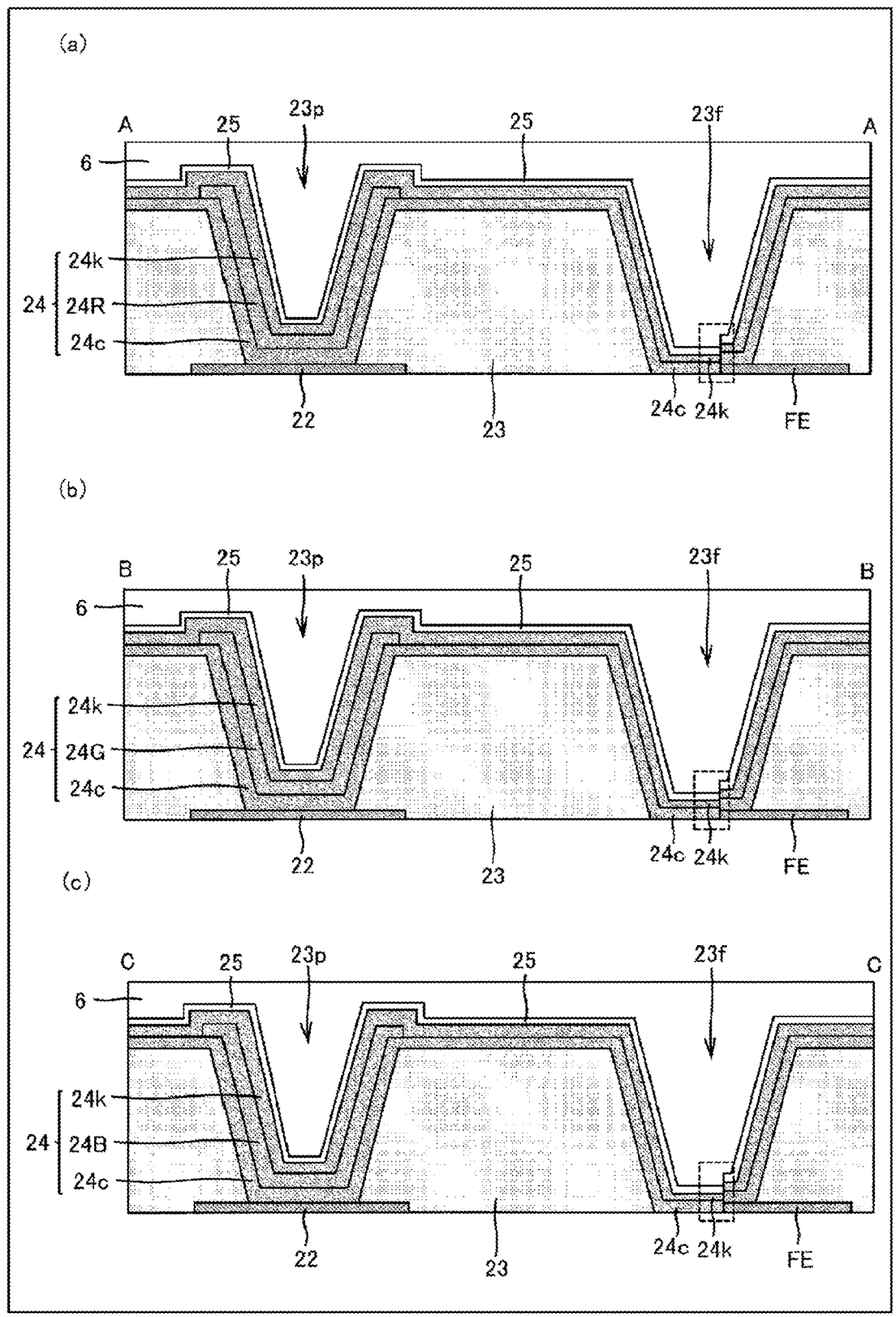
FIG. 4(a) is a cross-sectional view taken along a line A-A of FIG. 3.
FIG. 4(b) is a cross-sectional view taken along a line B-B of FIG. 3.
FIG. 4(c) is a cross-sectional view taken along a line C-C of FIG. 3.

FIG. 3 is a plan view illustrating a configuration of the display region. FIG. 4(a) is a cross-sectional view taken along a line A-A of FIG. 3, FIG. 4(b) is a cross-sectional view taken along a line B-B of FIG. 3, and FIG. 4(c) is a cross-sectional view taken along a line C-C of FIG. 3. FIG. 5(a) is a table showing configuration examples of the common function layer and the individual function layer, FIG. 5(b) is a table showing configuration examples of the first electrode and the auxiliary electrode, FIG. 5(c) is a table showing a configuration of the second electrode, and FIG. 5(d) is a schematic cross-sectional view illustrating a configuration of a portion surrounded by a broken line in FIG. 4 (near a bottom portion of a contact hole). The material, film thickness, and the like shown in FIG. 5 are merely examples.

As illustrated in FIGS. 3 and 4, in the display region DA, the red light-emitting element Xr, the green light-emitting element Xg, and the blue light-emitting element Xb are arranged in the row direction (right-left direction in the figure), and the auxiliary electrode FE having the row direction as the longitudinal direction is provided so as not to overlap the light-emitting elements Xr, Xg, and Xb. An opening 23p that exposes the first electrode 22 is formed in the edge cover film 23.

In the red light-emitting element Xr, a lower common function layer 24c, a red individual function layer 24R, an upper common function layer 24k, and the second electrode 25 are formed in this order so as to overlap the entire opening 23p. In the green light-emitting element Xg, the lower common function layer 24c, a green individual function layer 24G, the upper common function layer 24k, and the second electrode 25 are formed in this order so as to overlap the entire opening 23p. In the blue light-emitting element Xb, the lower common function layer 24c, a blue individual function layer 24B, the upper common function layer 24k, and the second electrode 25 are formed in this order so as to overlap the entire opening 23p.

As shown in FIG. 5(a), the upper common function layer 24k is constituted of, for example, the electron injection layer (common layer) with a film thickness of 10 nm, the electron transport layer (common layer) with a film thickness of 8 nm, and the hole blocking layer (common layer) with a film thickness of 10 nm. The lower common function layer 24c is constituted of the hole transport layer (common layer) and the hole injection layer (common layer), and a film thickness thereof is, for example, 130 nm. In this case, a film thickness of a common function layer 24X is 158 nm.

The individual function layer 24R is constituted of a light-emitting layer for red and a hole transport layer for red (as a lower layer underlying the light-emitting layer), and the film thickness thereof is, for example, 110 nm. The individual function layer 24G is constituted of a light-emitting layer for green and a hole transport layer for green (as a lower layer underlying the light-emitting layer), and the film thickness thereof is, for example, 40 nm. The individual function layer 24B is constituted of a light-emitting layer for blue and an electron blocking layer for blue (as a lower layer underlying the light-emitting layer), and the film thickness thereof is, for example, 20 nm.

The first electrode 22 and the auxiliary electrode FE formed in the same process have, for example, a configuration in which Ag with a film thickness of 80 nm is sandwiched between two layers of ITO (each film thickness is approximately 10 nm), and have a film thickness of 100 nm. The second electrode 25 has, for example, a configuration in which ytterbium (Yb) with a film thickness of 10 nm and a magnesium-silver alloy with a film thickness of 20 nm are layered, and has a film thickness of 30 nm.

The auxiliary electrode FE has an end portion Fz extending in the row direction. A contact hole 23f is formed in the edge cover film 23 so as to overlap the end portion Fz of the auxiliary electrode FE. The auxiliary electrode FE has two end portions, and the one end portion Fz overlaps with the contact hole 23f and is in contact with the second electrode 25.

As illustrated in FIGS. 3 to 5, the contact hole 23f exposes the end portion Fz of the auxiliary electrode FE, and the film thickness (100 nm) of the auxiliary electrode FE is greater than the film thickness (28 nm) of the upper common function layer 24k including the electron injection layer EIL. Therefore, the upper common function layer 24k including the electron injection layer EIL constituted of, for example, lithium fluoride (LiF) is separated stepwise (discontinuous) at an upper portion of the end portion Fz of the auxiliary electrode FE.

As described above, in the first embodiment, the upper common function layer 24k including the electron injection layer EIL is naturally separated stepwise in the vapor deposition process or the like. Therefore, while simplifying the process of forming the upper common function layer 24k including the electron injection layer EIL, a charge path (i.e., a charge path via the lower common function layer 24c) from the second electrode 25 to the auxiliary electrode FE, which is indicated by an arrow in FIG. 5(d), may be formed without passing through the upper common function layer 24k (including the high resistance electron injection layer EIL). The electrical resistance value of the lower common function layer 24c is smaller than the electrical resistance value of the upper common function layer 24k (including the electron injection layer EIL).

As illustrated in FIG. 5, since the film thickness of the auxiliary electrode FE is greater than the film thickness of the upper common function layer 24k, the second electrode 25 is in contact with the lower common function layer 24c in the contact hole 23f. Thus, the second electrode 25 is electrically connected to the auxiliary electrode FE via the lower common function layer 24c.

The lower common function layer 24c is a common layer between the first electrode 22 and the light-emitting layers (24R, 24G, and 24B), and includes, for example, the hole injection layer and the hole transport layer. The lower common function layer 24c may be configured to include an electron blocking layer. The upper common function layer 24k is a common layer between the light-emitting layers (24R, 24G, and 24B) and the second electrode 25, and may include, for example, the hole blocking layer, the electron transport layer, and the electron injection layer EIL.

Since the same power supply voltage (for example, cathode voltage ELVSS) as that of the second electrode 25 is supplied to the auxiliary electrode FE, substantial reduction of the resistance of the second electrode 25 (common cathode) can be easily carried out. This improves the uniformity of the in-plane brightness in the display region DA. In the first embodiment, the auxiliary electrode FE is configured in the same layer and is made of the same material as the first electrode 22, but the disclosure is not limited thereto.

Second Embodiment

Figure 6:
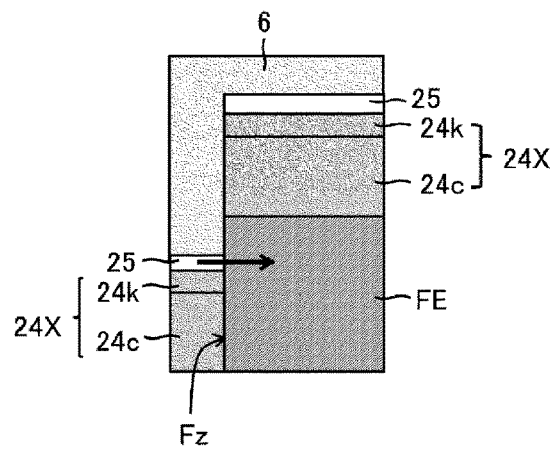
FIG. 6(a) is a table showing configuration examples of the common function layer.
FIG. 6(b) is a table showing a configuration example of the first electrode and the auxiliary electrode.
FIG. 6(c) is a schematic cross-sectional view illustrating a configuration of the near a bottom portion of a contact hole according to a second embodiment.

FIG. 6(a) is a table showing configuration examples of the common function layer, FIG. 6(b) is a table showing a configuration example of the first electrode and the auxiliary electrode, and FIG. 6(c) is a schematic cross-sectional view illustrating a configuration near a bottom portion of the contact hole according to a second embodiment. The material, film thicknesses, and the like shown in FIG. 6 are merely examples.

In the second embodiment, the film thickness (220 nm) of the auxiliary electrode FE is made greater than the film thickness (158 nm) of the common function layer 24X, and the common function layer 24X is separated stepwise at the end portion Fz of the auxiliary electrode FE. In this way, the end portion Fz (end face) of the auxiliary electrode FE and the second electrode 25 are in direct contact with each other, and the second electrode 25 and the auxiliary electrode FE are electrically connected.

As described above, in the second embodiment, the common function layer 24X is naturally separated stepwise in the vapor deposition process or the like, and the second electrode 25 and the end face of the auxiliary electrode FE are in contact with each other. Therefore, while simplifying the patterning process of the common function layer 24X, a charge path (not via the high resistance 24k) from the second electrode 25 to the auxiliary electrode FE as illustrated in FIG. 6(c) can be formed. As a result, the resistance of the second electrode 25 can be effectively reduced.

In the second embodiment, as illustrated in FIG. 6, the film thickness of the auxiliary electrode FE is greater than the total film thickness of the upper common function layer 24k and the lower common function layer 24c (the film thickness of the common function layer 24X). Therefore, the second electrode 25 and the auxiliary electrode FE are in contact with each other in the contact hole 23f. Therefore, the contact resistance can be reduced.

Third Embodiment

Figure 7:
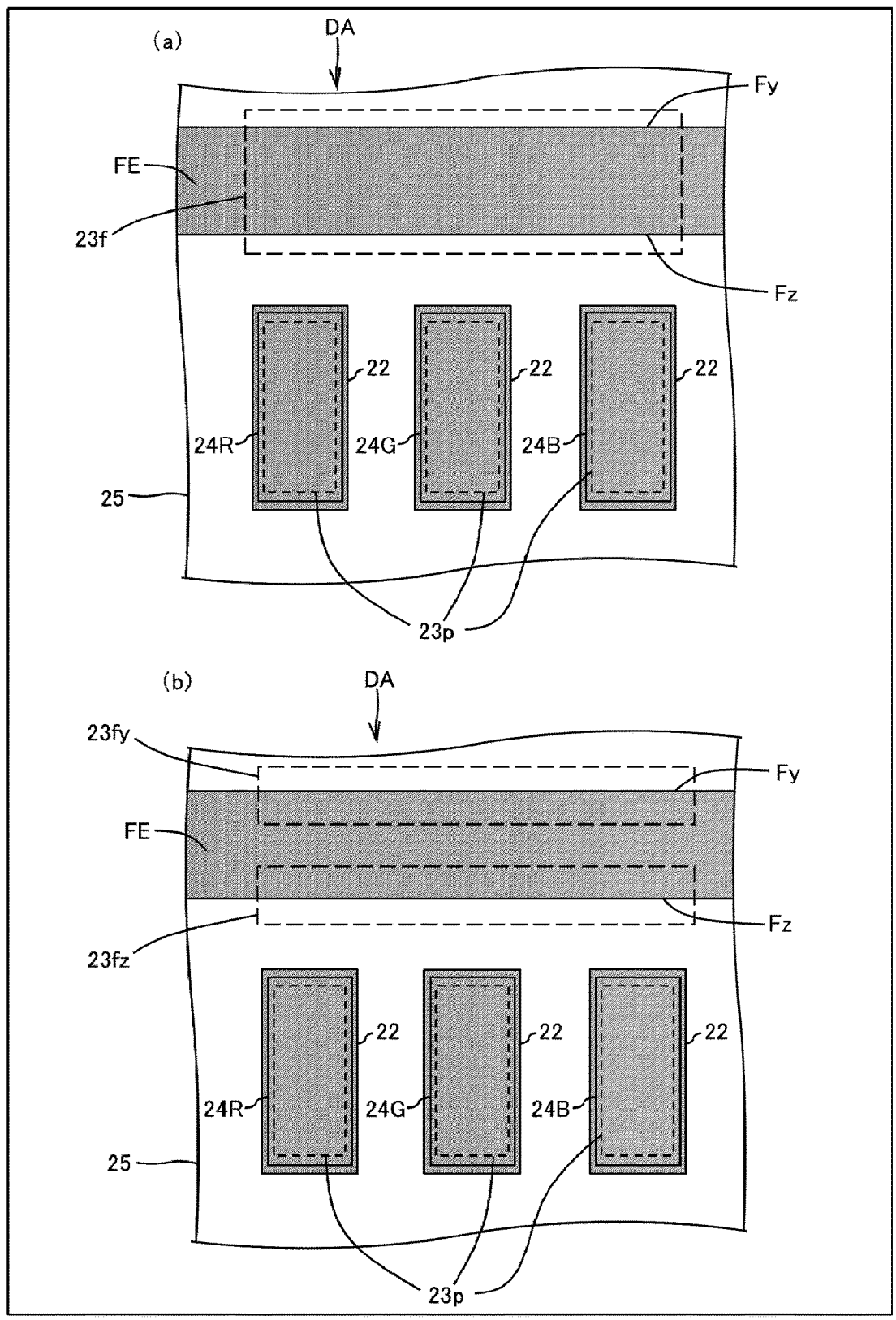
FIGS. 7(a) and (b) are plan views illustrating configurations of display regions according to a third embodiment.

FIGS. 7(a) and (b) are plan views illustrating configurations of display regions according to a third embodiment. As illustrated in FIG. 7(a), the auxiliary electrode FE may have two end portions Fy and Fz extending in the row direction, and the contact hole 23f may overlap with the two end portions Fy and Fz. In this way, the distance separated stepwise of the electron injection layer EIL is increased, and the charge path between the second electrode 25 and the auxiliary electrode FE is increased, so that the resistance of the second electrode 25 can be further reduced. As illustrated in FIG. 7(b), a contact hole 23fy overlapping the end portion Fy and a contact hole 23fz overlapping the end portion Fz may be provided.

Fourth Embodiment

Figure 8:
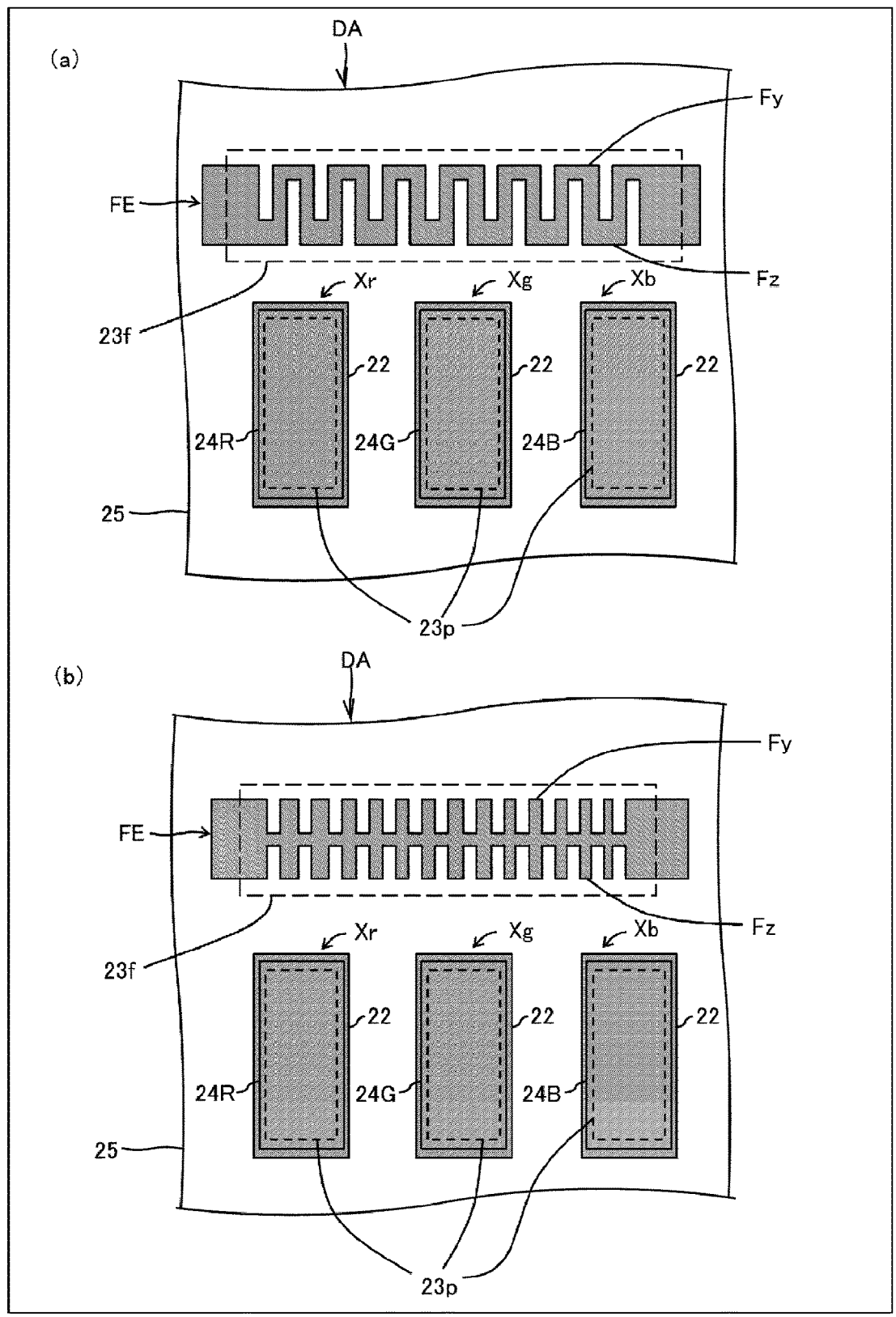
FIGS. 8(a) and (b) are plan views illustrating a configuration of display regions according to a fourth embodiment.

FIGS. 8(a) and (b) are plan views illustrating configurations of display regions according to a fourth embodiment. As illustrated in FIG. 8(a), the auxiliary electrode FE may have a meandering shape, and the end portions Fy and Fz of the auxiliary electrode FE may each have a comb shape. As illustrated in FIG. 8(b), the auxiliary electrode FE may have a fishbone shape, and the end portions Fy and Fz of the auxiliary electrode FE may each have a comb shape. In FIG. 8, by forming the contact hole 23f so as to overlap with the comb-shaped end portions Fy and Fz, the distance separated stepwise of the upper common function layer 24k including the electron injection layer EIL increases, and the charge path between the second electrode 25 and the auxiliary electrode FE is increased. Therefore, the resistance of the second electrode 25 can be further reduced.

Fifth Embodiment

Figure 9:
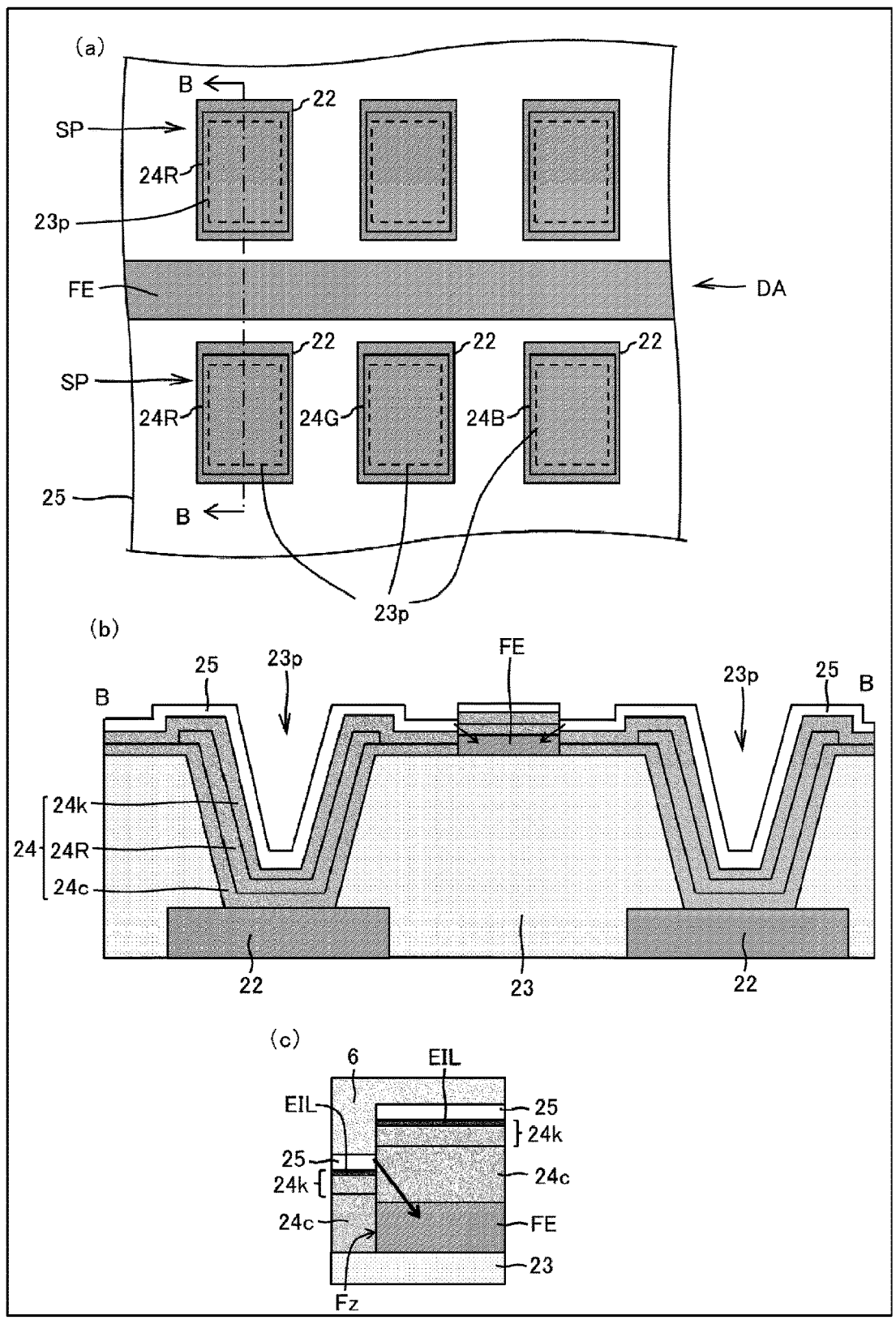
FIG. 9(a) is a plan view illustrating a configuration of a display region.
FIG. 9(b) is a cross-sectional view taken along a line B-B of FIG. 9(a)
FIG. 9(c) is a schematic cross-sectional view illustrating a configuration near an edge of the auxiliary electrode.

FIG. 9(a) is a plan view illustrating a configuration of a display region according to a fifth embodiment, FIG. 9(b) is a cross-sectional view taken along a line B-B of FIG. 9(a), and FIG. 9(c) is a schematic cross-sectional view illustrating a configuration near an edge of the auxiliary electrode. As illustrated in FIG. 9, the auxiliary electrode FE formed on the edge cover film 23 is provided between the adjacent subpixels SP. The process of forming the auxiliary electrode FE is performed between the process of forming the edge cover film 23 and the process of forming the function layer 24. Here, by making the film thickness of the auxiliary electrode FE greater than the film thickness of the upper common function layer 24k including the electron injection layer EIL, the upper common function layer 24k including the electron injection layer EIL can be separated stepwise at the upper portion of the end portion Fz of the auxiliary electrode FE.

As described above, in the fifth embodiment, the upper common function layer 24k including the electron injection layer EIL is naturally separated stepwise in the vapor deposition process or the like. Therefore, while simplifying the patterning process of the upper common function layer 24k including the electron injection layer EIL, a charge path is formed from the second electrode 25 to the auxiliary electrode FE, which is indicated by an arrow in FIG. 9(c), without passing through the upper common function layer 24k (including the high resistance electron injection layer EIL). Since the same power supply voltage (for example, ELVSS) as that of the second electrode 25 is supplied to the auxiliary electrode FE, the resistance of the second electrode 25 (cathode) can be substantially reduced. This improves the uniformity of the in-plane brightness in the display region DA.

In the fifth embodiment, the film thickness of the auxiliary electrode FE may be made greater than the film thickness of the common function layer 24X, and the common function layer 24X may be separated stepwise at the end portion Fz of the auxiliary electrode FE. In this way, the end portion Fz of the auxiliary electrode FE and the second electrode 25 are in direct contact with each other, and the second electrode 25 and the auxiliary electrode FE are electrically connected, so that the resistance of the second electrode 25 can be further reduced.

Sixth Embodiment

FIG. 10(a) is a plan view illustrating a configuration of a display region according to a sixth embodiment, and FIG. 10(b) is a cross-sectional view of FIG. 10(a). In the sixth embodiment, a first flattening film 21a, a fourth metal layer, and a second flattening film 21b are provided in this order between the third metal layer including the data signal line DL of FIG. 1 and the first electrode 22 (anode), an auxiliary wiring line FW and a relay electrode LE (fourth metal layer) are formed on the first flattening film 21a, the first electrode 22 and the auxiliary electrode FE are formed on the second flattening film 21b, and the edge cover film 23 is formed so as to cover the edge of the first electrode 22. The first flattening film 21a and the second flattening film 21b can be constituted of, for example, a coatable organic material such as polyimide or acrylic resin. The fourth metal layer is constituted of, for example, a single-layer film or a multi-layer film of metal including at least one of aluminum, titanium, tungsten, molybdenum, tantalum, chromium, and copper.

The edge cover film 23 is formed with the opening 23p that exposes the first electrode 22 and the contact hole 23f that overlaps with the end portion Fz of the auxiliary electrode FE. The second flattening film 21b is formed with a contact hole 21f that electrically connects the auxiliary electrode FE and the auxiliary wiring line FW, and a contact hole 21p that electrically connects the first electrode 22 and the relay electrode LE. The first electrode 22 is connected to an electrode DE of the transistor of the thin film transistor layer 4 via the relay electrode LE.

Figure 10:
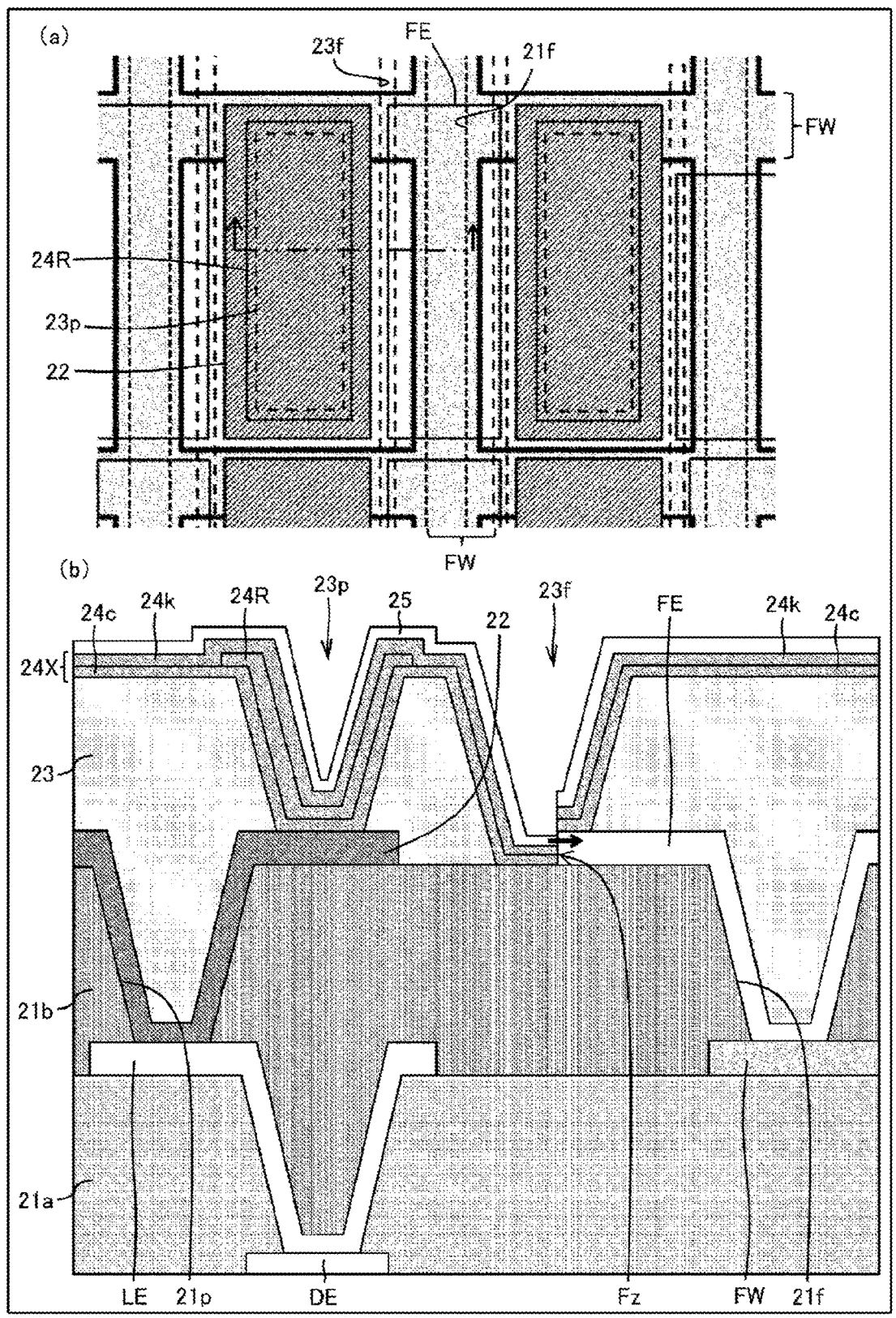
FIG. 10(a) is a plan view illustrating a configuration of a display region.
FIG. 10(b) is a cross-sectional view of FIG. 10(a).

As illustrated in FIG. 10, the end portion Fz of the auxiliary electrode FE is exposed by the contact hole 23f and the film thickness of the auxiliary electrode FE is greater than the film thickness of the common function layer 24X. Therefore, the common function layer 24X is separated stepwise at the upper portion of the end portion Fz of the auxiliary electrode FE.

As described above, in the sixth embodiment, the common function layer 24X is naturally separated stepwise in the vapor deposition process or the like, and the second electrode 25 and the end face of the auxiliary electrode FE are in contact with each other. Therefore, while simplifying the patterning process of the common function layer 24X, a charge path is formed (not via the high resistance 24k) from the second electrode 25 to the auxiliary electrode FE indicated by an arrow in FIG. 10(b). Since the same power supply voltage (for example, ELVSS) as that of the second electrode 25 is supplied to the auxiliary electrode FE via the auxiliary wiring line FW, the resistance of the second electrode 25 can be substantially reduced.

In the sixth embodiment, since the first electrode 22 and the auxiliary wiring line FW are formed in separate layers, the degree of freedom in the layout of the auxiliary wiring line FW is high. Thus, as illustrated in FIG. 10(a), the auxiliary wiring line FW has a matrix shape (lattice shape) that overlaps with the first electrode 22, and the resistance of the second electrode 25 can be further reduced.

Figure 11:
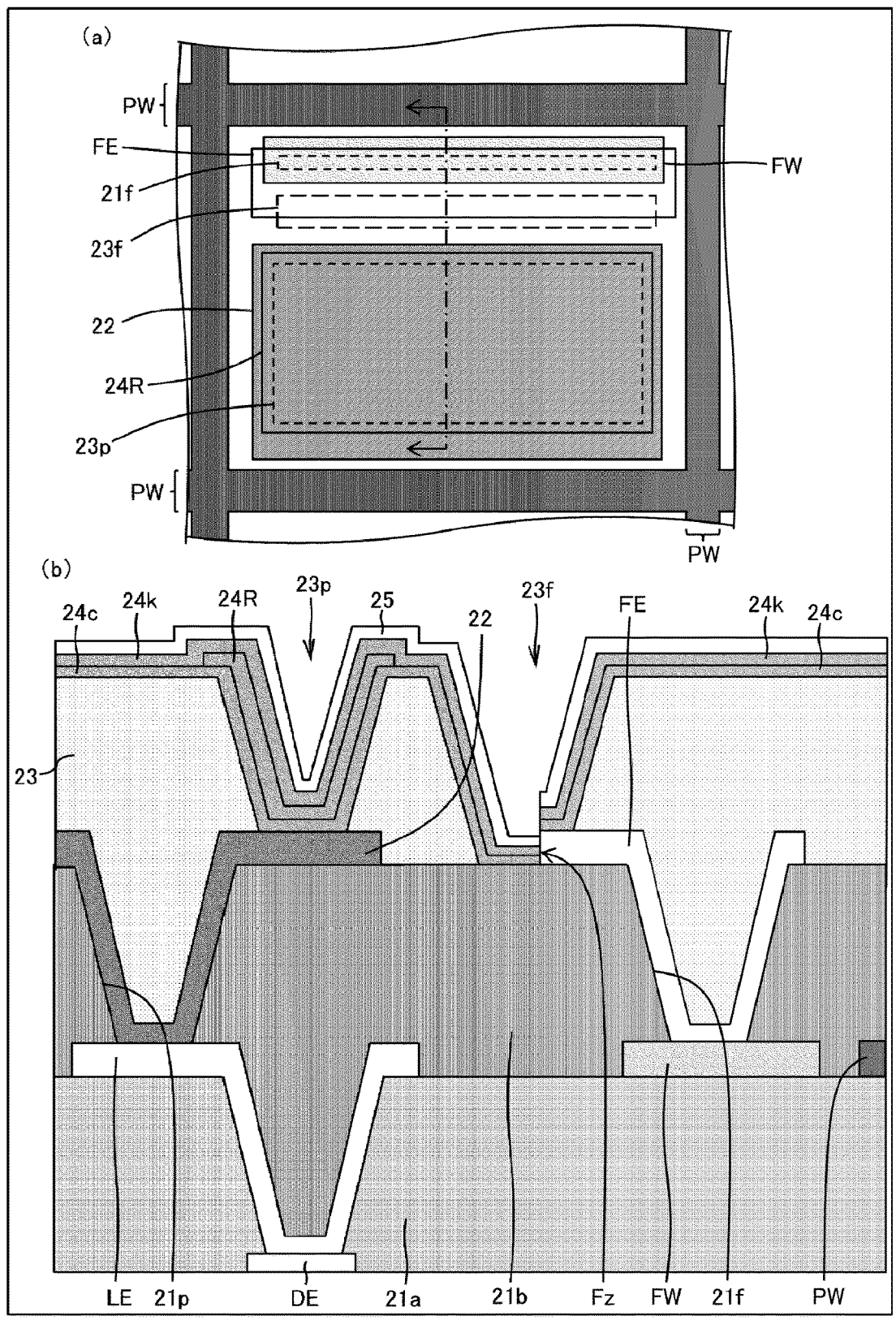
FIG. 11(a) is a plan view illustrating another configuration of the display region.
FIG. 11(b) is a cross-sectional view of FIG. 11(a).

FIG. 11(a) is a plan view illustrating another configuration of the display region, and FIG. 11(b) is a cross-sectional view of FIG. 11(a). As illustrated in FIG. 11, the high voltage power source line PW may be formed in a matrix shape in the fourth metal layer including the auxiliary wiring line FW and the relay electrode LE. In this case, the auxiliary wiring line FW is formed in an island shape in a region surrounded by the high voltage power source line PW.

The embodiments described above are for purposes of illustration and description, and not for limitation. It will be apparent to those skilled in the art that many variations are possible in accordance with these illustrations and descriptions.

Supplement

First Aspect

A display device having a display region provided with a plurality of subpixels and a frame region surrounding the display region, the display device including a thin film transistor layer, a light-emitting element layer in which a plurality of light-emitting elements each including a first electrode, a function layer, and a second electrode are formed, and a sealing layer configured to seal the light-emitting element layer, in which the light-emitting element layer is provided with an edge cover film that has an opening configured to expose the first electrode and covers an edge of the first electrode, the second electrode is provided in common to the plurality of light-emitting elements, an auxiliary electrode electrically connected to the second electrode is provided on an upper side or a lower side of the edge cover film, the function layer includes a common function layer commonly provided for the plurality of light-emitting elements and individual function layers, each of which is provided corresponding to each of the plurality of light-emitting elements, the common function layer includes an upper common function layer provided between light-emitting layers included in the individual function layers, respectively, and the second electrode, and a film thickness of the auxiliary electrode is greater than a film thickness of the upper common function layer.

Second Aspect

The display device according to, for example, the first aspect in which the upper common function layer is separated stepwise at an upper portion of an end portion of the auxiliary electrode.

Third Aspect

The display device according to, for example, the first or second aspect, in which the common function layer includes a lower common function layer provided between the first electrode and the light-emitting layers included in the individual function layers, respectively, and the film thickness of the auxiliary electrode is greater than a total film thickness of the lower common function layer and the upper common function layer.

Fourth Aspect

The display device according to, for example, any one of the first to third aspects, in which the auxiliary electrode is electrically connected to the second electrode via a contact hole provided in the edge cover film.

Fifth Aspect

The display device according to, for example, the fourth aspect, in which the auxiliary electrode has two end portions, and one end portion overlaps with the contact hole and is in contact with the second electrode.

Sixth Aspect

The display device according to, for example, the fifth aspect, in which another end portion of the auxiliary electrode overlaps with the contact hole and is in contact with the second electrode.

Seventh Aspect

The display device according to, for example, the fifth aspect, in which another end portion of the auxiliary electrode overlaps with another contact hole and is in contact with the second electrode.

Eighth Aspect

The display device according to, for example, the fourth aspect, in which the auxiliary electrode has a comb-shaped end portion, and the comb-shaped end portion overlaps with the contact hole and is in contact with the second electrode.

Ninth Aspect

The display device according to, for example, any one of the first to third aspects, in which the auxiliary electrode is located in a layer overlying the edge cover film between adjacent subpixels.

Tenth Aspect

The display device according to, for example, any one of the first to eighth aspects, in which the auxiliary electrode is formed in the same layer and made of the same material as the first electrode.

Eleventh Aspect

The display device according to, for example, any one of the first to eighth aspects, in which the thin film transistor layer includes a first flattening film, an auxiliary wiring line formed on the first flattening film, and a second flattening film formed on the auxiliary wiring line, the first electrode is formed on the second flattening film and is electrically connected to a transistor of the thin film transistor layer via a first contact hole formed in the second flattening film, and the auxiliary electrode is electrically connected to the auxiliary wiring line via a second contact hole formed in the second flattening film.

Twelfth Aspect

The display device according to, for example, eleventh aspect, in which the auxiliary wiring line is formed in a matrix shape in a state of overlapping the first electrode.

Thirteenth Aspect

The display device according to, for example, eleventh aspect, in which a power supply voltage line formed in the same layer and made of the same material as the auxiliary wiring line is formed in a matrix shape.

Fourteenth Aspect

The display device according to, for example, thirteenth aspect, in which the auxiliary wiring line is formed in an island shape surrounded by the power supply voltage line in a plan view.

Fifteenth Aspect

The display device according to any one of the first to fourteenth aspects, wherein an electron injection layer included in the upper common function layer is constituted of lithium fluoride.

The invention claimed is:

1. A display device including a display region provided with a plurality of subpixels and a frame region surrounding the display region, the display device comprising:
    a thin film transistor layer;
    a light-emitting element layer in which a plurality of light-emitting elements is formed, each of the plurality of light-emitting elements including a first electrode, a function layer, and a second electrode; and
    a sealing layer configured to seal the light-emitting element layer,
    wherein the light-emitting element layer is provided with an edge cover film that has an opening configured to expose the first electrode and that covers an edge of the first electrode,
    the second electrode is provided in common to the plurality of light-emitting elements,
    an auxiliary electrode electrically connected to the second electrode is provided on an upper side or a lower side of the edge cover film,
    the function layer includes a common function layer commonly provided for the plurality of light-emitting elements and individual function layers, each of the individual function layers is provided corresponding to each of the plurality of light-emitting elements,
    the common function layer includes an upper common function layer provided between light-emitting layers included in the individual function layers, respectively, and the second electrode,
    a film thickness of the auxiliary electrode is greater than a film thickness of the upper common function layer,
    a lower common function layer is provided between the first electrode and the light-emitting layers included in the individual function layers, respectively, and
    an electrical resistance value of the lower common function layer is smaller than an electrical resistance value of the upper common function layer so that a charge path, via the lower common function layer, from the second electrode to the auxiliary electrode is formable without passing through the upper common function layer.

2. The display device according to claim 1, wherein the upper common function layer is separated stepwise at an upper portion of an end portion of the auxiliary electrode.

3. The display device according to claim 1, wherein the film thickness of the auxiliary electrode is greater than a total film thickness of the lower common function layer and the upper common function layer.

4. The display device according to claim 1,
wherein the auxiliary electrode is electrically connected to the second electrode via a contact hole provided in the edge cover film.

5. The display device according to claim 4,
wherein the auxiliary electrode has two end portions, and one of the two end portions overlaps with the contact hole and is in contact with the second electrode.

6. The display device according to claim 5,
wherein another one of the two end portions of the auxiliary electrode overlaps with the contact hole and is in contact with the second electrode.

7. The display device according to claim 5,
wherein another one of the two end portions of the auxiliary electrode overlaps with another contact hole and is in contact with the second electrode.

8. The display device according to claim 4,
wherein the auxiliary electrode has a comb-shaped end portion, and the comb-shaped end portion overlaps with the contact hole and is in contact with the second electrode.

9. The display device according to claim 1,
wherein the auxiliary electrode is located in a layer adjacent the edge cover film between adjacent subpixels.

10. The display device according to claim 1,
wherein the auxiliary electrode is formed in the same layer and made of the same material as the first electrode.

11. The display device according to claim 1,
wherein the thin film transistor layer includes a first flattening film, an auxiliary wiring line formed on the first flattening film, and a second flattening film formed on the auxiliary wiring line,
the first electrode is formed on the second flattening film and is electrically connected to a transistor of the thin film transistor layer via a first contact hole formed in the second flattening film, and
the auxiliary electrode is electrically connected to the auxiliary wiring line via a second contact hole formed in the second flattening film.

12. The display device according to claim 11,
wherein the auxiliary wiring line is formed in a matrix shape in a state of overlapping the first electrode.

13. The display device according to claim 11,
wherein a power supply voltage line formed in the same layer and made of the same material as the auxiliary wiring line is formed in a matrix shape.

14. The display device according to claim 13,
wherein the auxiliary wiring line is formed in an island shape surrounded by the power supply voltage line in a plan view.

15. The display device according to claim 1,
wherein an electron injection layer included in the upper common function layer comprises lithium fluoride.

* * * * *